United States Patent [19]
Ashuri

[11] Patent Number: 5,489,864
[45] Date of Patent: Feb. 6, 1996

[54] DELAY INTERPOLATION CIRCUITRY

[75] Inventor: Roni Ashuri, Haifa, Israel

[73] Assignee: Intel Corporation, Santa Clara, Calif.

[21] Appl. No.: 394,174

[22] Filed: Feb. 24, 1995

[51] Int. Cl.$^6$ .............................. H03K 5/13; H03K 5/159
[52] U.S. Cl. .......................... 327/161; 327/105; 327/276; 327/292
[58] Field of Search ..................................... 327/141, 144, 327/149, 155, 158, 161, 231, 233, 236, 243, 244, 245, 250, 251, 291, 292, 299, 261, 269, 262, 263, 270, 276, 277, 284, 105–107; 364/717, 718

[56] References Cited

U.S. PATENT DOCUMENTS

| | | | |
|---|---|---|---|
| 4,623,805 | 11/1986 | Flora et al. | 327/161 |
| 4,899,071 | 2/1990 | Morales | 327/277 |
| 4,980,585 | 12/1990 | Bazes | 364/718 |
| 5,036,230 | 7/1991 | Bazes | 327/269 |
| 5,144,173 | 9/1992 | Hui | 327/277 |
| 5,179,303 | 1/1993 | Scarles et al. | 327/277 |
| 5,243,227 | 9/1993 | Gutierrez, Jr. et al. | 327/277 |
| 5,410,263 | 4/1995 | Walzman | 327/141 |

Primary Examiner—Timothy P. Callahan
Assistant Examiner—Eunja Shin
Attorney, Agent, or Firm—Blakely, Sokoloff, Taylor & Zafman

[57] ABSTRACT

An integrated circuit for deskewing and adjusting a delay of a synthesized waveform. The synthesized waveform is initially produced by a digital-to-time domain converter which is coupled to a synchronous delay line and a pattern ROM through a shifter and a pattern register. The synchronous delay line generates a plurality of taps in response to a reference signal. Each one of the taps has a unit delay and is coupled to the digital-to-time domain converter. The integrated circuit which deskews and adjusts the delay of the synthesized waveform comprises a microdelay calibration circuit, a deskew control circuit, and a delay interpolation circuit. The microdelay calibration circuit is coupled to the taps of the synchronous delay line and the deskew control circuit. The deskew control circuit is coupled the shifter to perform coarse deskew operations. The deskew control circuit is further coupled to the delay interpolation circuit to perform fine deskew operations. The output of the digital to time domain converter is coupled to the delay interpolation circuit which then outputs a deskewed synthesized waveform. Deskew resolution of 0.05 ns is achieved with the integrated circuit described herein.

14 Claims, 5 Drawing Sheets

FIG_2

FIG_4

DELAY INTERPOLATION CIRCUITRY

I. BACKGROUND OF THE INVENTION

A. Field of the Invention

This invention relates to digital waveform synthesis and, more particularly, to the deskewing and fine adjustment of output delay of digitally synthesized waveforms.

B. Description of the Prior Art

Analog phase-locked loops (PLLs) have found numerous applications in microprocessor clock generators in recent years. Duties performed by the PLLs include deskewing, duty-cycle control, and frequency multiplication. Recent trends in CMOS technology and in microprocessor design, however, make the use of analog PLLs as a decreasingly attractive solution when implementing microprocessor clock generators.

For example, analog PLLs typically use circuits that operate in saturation, such as current sources, current mirrors, charge pumps, and operational amplifiers. The current trend of rapid scaling-down of supply voltages in microprocessor design have increased the difficulty of implementing circuits that operate in saturation. Furthermore, the general incompatibility of analog design with digitally-oriented technologies, methodologies, and CAD tools also make implementation of analog PLL designs increasingly difficult. Thus, the use of exclusively digital techniques for implementing microprocessor clocks is desired.

A prior art technique for synthesizing clock waveforms is presented in U.S. Pat. No. 5,036,230, entitled "CMOS CLOCK-PHASE SYNTHESIZER," and assigned to the assignee of the present invention. The CMOS clock-phase synthesizer disclosed in U.S. Pat. No. 5,036,230, however, lacks abilities featured by the present invention including the ability to fine tune and deskew output waveforms. As a consequence, the resolution of the prior art CMOS clock-phase synthesizer is limited by the relatively large unit delay of the taps of the corresponding synchronous delay line.

II. SUMMARY OF THE INVENTION

An integrated circuit for deskewing and adjusting a delay of a synthesized waveform is described. The synthesized waveform is initially produced by a digital-to-time domain converter which is coupled to a synchronous delay line and a pattern ROM through a shifter and a pattern register. The synchronous delay line generates a plurality of taps in response to a reference signal. Each one of the taps has a unit delay and is coupled to the digital-to-time domain converter. The integrated circuit described herein comprises a microdelay calibration circuit, a deskew control circuit, and a delay interpolation circuit. The microdelay calibration circuit is coupled to the synchronous delay line and the deskew control circuit. The deskew control circuit is further coupled to the shifter and the delay interpolation circuit. The delay interpolation circuit receives the output of the digital to time domain converter and outputs a deskewed synthesized waveform. The integrated circuit described herein has the ability to deskew the synthesized waveforms with a 0.05 ns resolution independent of frequency.

III. BRIEF DESCRIPTION OF THE DRAWINGS

IV. DETAILED DESCRIPTION

An integrated circuit for deskewing and adjusting a delay of a synthesized waveform is described. In the following description, numerous specific details are set forth such as specific circuits in order to provide a thorough understanding of the present invention. The present invention, however, may be practiced without these specific details. In other instances, the details of well-known circuitry are not shown here in order not to obscure the present invention unnecessarily. In the following description, the presently preferred embodiment is used as part of an Interpolating Clock Synthesizer. The invention may also be used, however, in other similarly configured digital waveform synthesizers.

Figure 1:
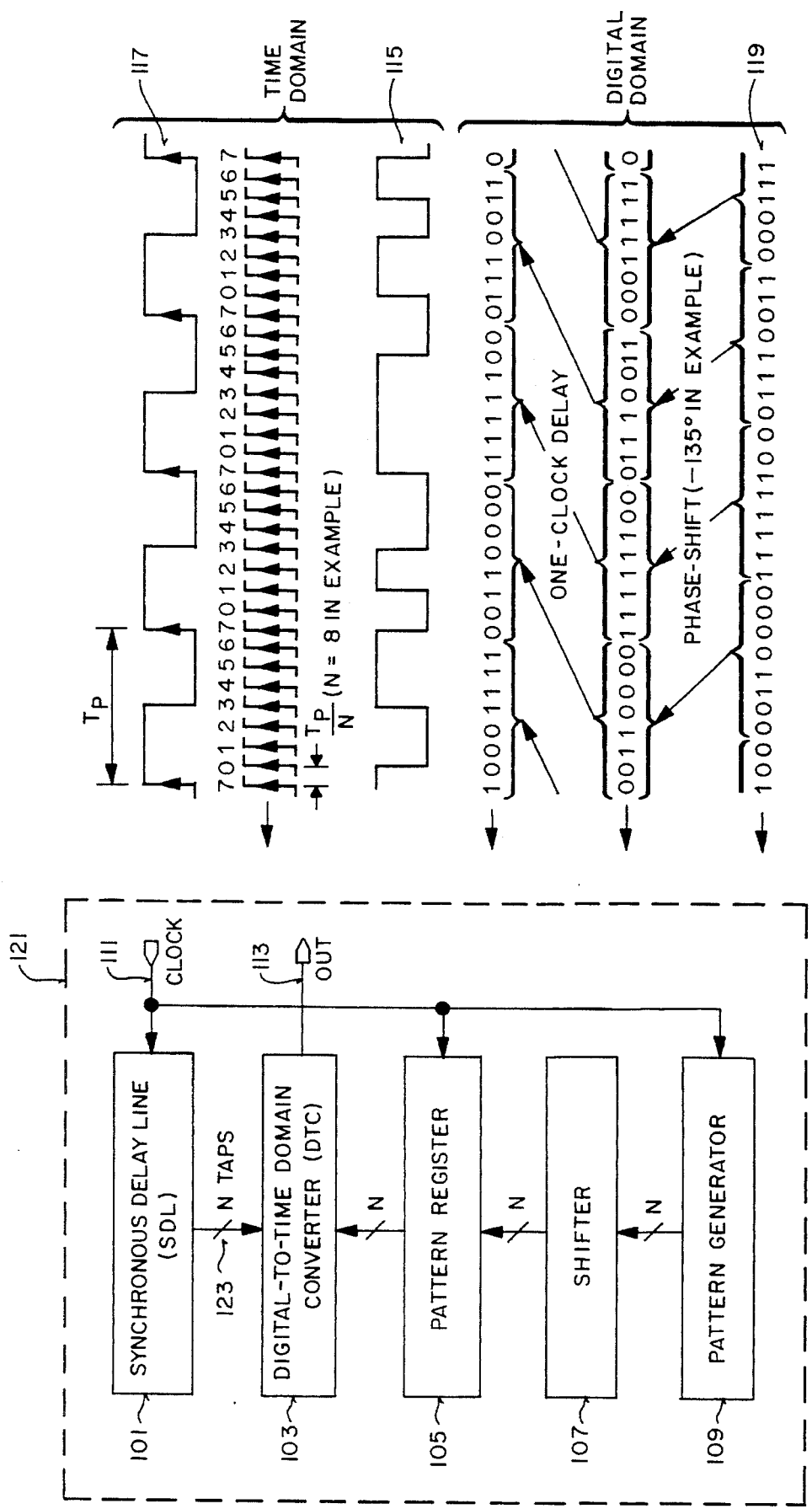
FIG. 1 is a block diagram illustrating the basic elements of a digital waveform synthesizer.

FIG. 1 illustrates in block diagram form the key elements of a basic digital waveform synthesizer 121. The N taps 123 of synchronous delay line (SDL) 101 are coupled to digital-to-time domain converter (DTC) 103. DTC 103 is further coupled to receive input from pattern generator 109 over a shifter 107 and pattern register 105. SDL 101, pattern register 105, and pattern generator 109 are coupled to receive clock signal 117 from clock input 111, and DTC 103 outputs the synthesized waveform 115 on output 113. As shown in FIG. 1, use of shifter 107 provides the digital waveform synthesizer 121 the ability to shift selectively patterns 119 received from pattern generator 109 in order to alter the phase or delay of synthesized waveform 115. Accordingly, the resolution of the digital waveform synthesizer is limited to the unit delay associated with each of the individual taps 123 of SDL 101.

Figure 2:
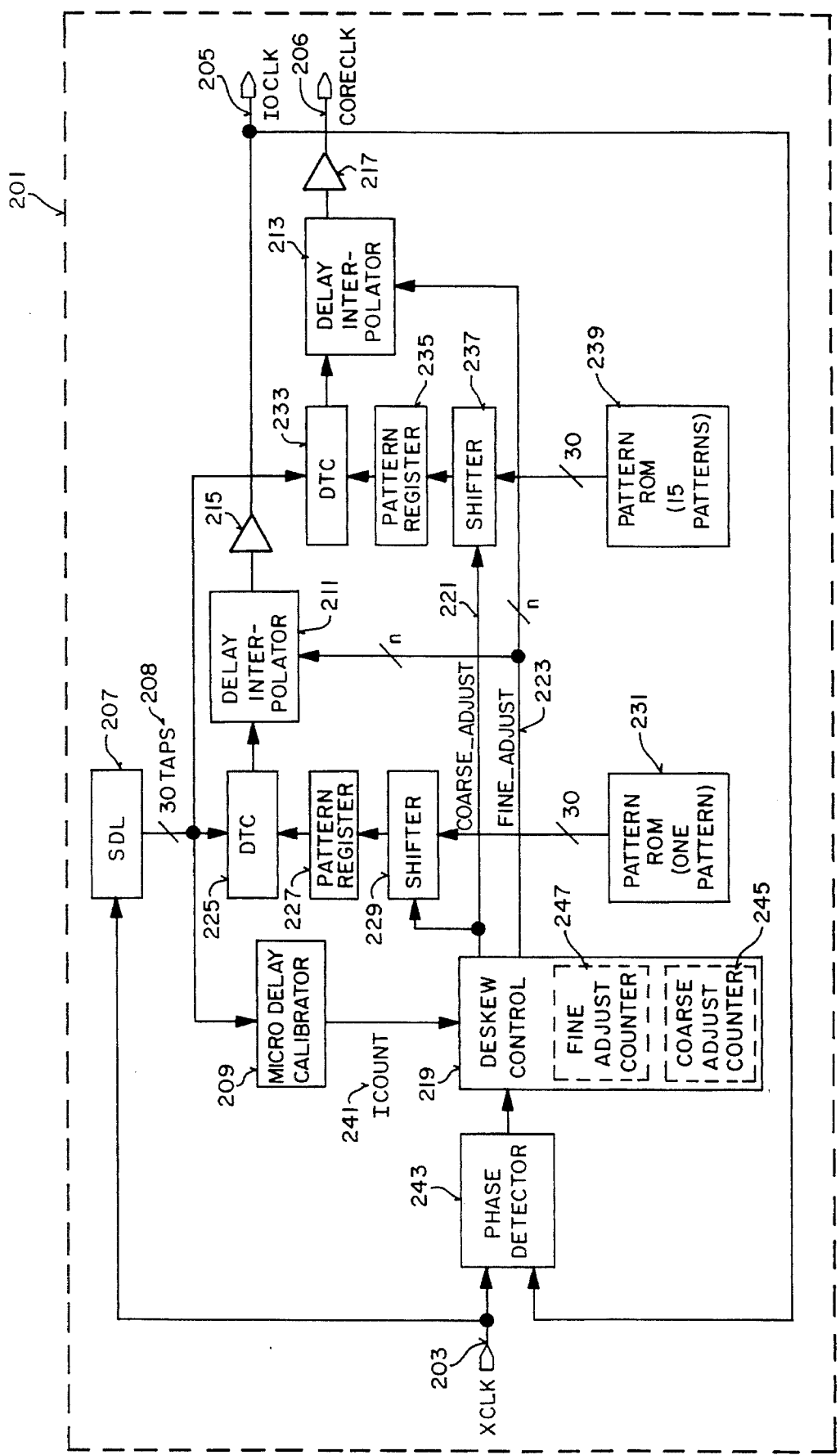
FIG. 2 is a block diagram illustrating the presently preferred embodiment of an Interpolating Clock Synthesizer.

FIG. 2 is a block diagram of an interpolating clock synthesizer (ICS) 201, the presently preferred embodiment of the present invention. Reference clock (XCLK) 203 is externally provided and clocks all ICS 201 logic. XCLK 203 is coupled to SDL 207 and phase detector 243. ICS 201 outputs are IOCLK 205 and CORECLK 206 and are buffered through buffers 215 and 217, respectively. Buffer 215 generates IOCLK 205 receives input from DTC 225 through delay interpolator 211. Buffer 217 generates CORECLK 206 and receives input from DTC 233 through delay interpolator 213. DTC 225 is coupled to receive input from pattern ROM 231 through shifter 229 and pattern register 227. Correspondingly, DTC 233 is coupled to receive input from pattern ROM 239 through shifter 237 and pattern register 235.

The SDL taps 208 of SDL 207 are coupled to microdelay calibrator 209 and DTCs 225 and 233. Microdelay calibrator 209 outputs ICOUNT 241 to deskew control 219. Deskew control 219 includes coarse adjust counter 245 and fine adjust counter 247. Deskew control 219 outputs COURSE_ADJUST 221 to shifters 229 and 237. Deskew control 219 also outputs FINE_ADJUST 223 to delay interpolators 211 and 213. FINE_ADJUST 223 includes n lines. Delay interpolator 211 outputs IOCLK 205 through buffer 215 and receives FINE_ADJUST 225 from digital phase detector 249. Delay interpolator 213 outputs CORECLK 206 through buffer 217 and receives FINE_ADJUST 223 from digital phase detector 249. Digital phase detector 243 receives inputs from XCLK 203 and IOCLK 205.

The presently preferred embodiment of the synchronous delay line 207 for use with the present invention is described in the pending patent application, Ser. No. 08/509,116, filed on Jul. 28, 1995 and entitled "IMPROVED SYNCHRONOUS DELAY LINE."

ICS 201 utilizes basic elements of the digital waveform synthesizer of FIG. 1 to perform the same functions as PLL-based clock generators, including deskewing, duty-cycle control and frequency multiplication using exclusively digital techniques. Further, ICS 201 is not limited to the unit delays associated with each of the individual taps of SDL as described above. Using the presently preferred embodiment, IOCLK 205 may be used to clock a microprocessor bus-interface unit, and CORECLK 206 may be used to clock microprocessor core logic. IOCLK 205 toggles at the same frequency as XCLK 203, and CORECLK 206 toggles at a frequency P/Q times the frequency of XCLK 203. IOCLK 205 is directly deskewed with respect to XCLK 203. CORECLK 206 is indirectly deskewed by matching its delay to that of IOCLK 205.

Figure 3:
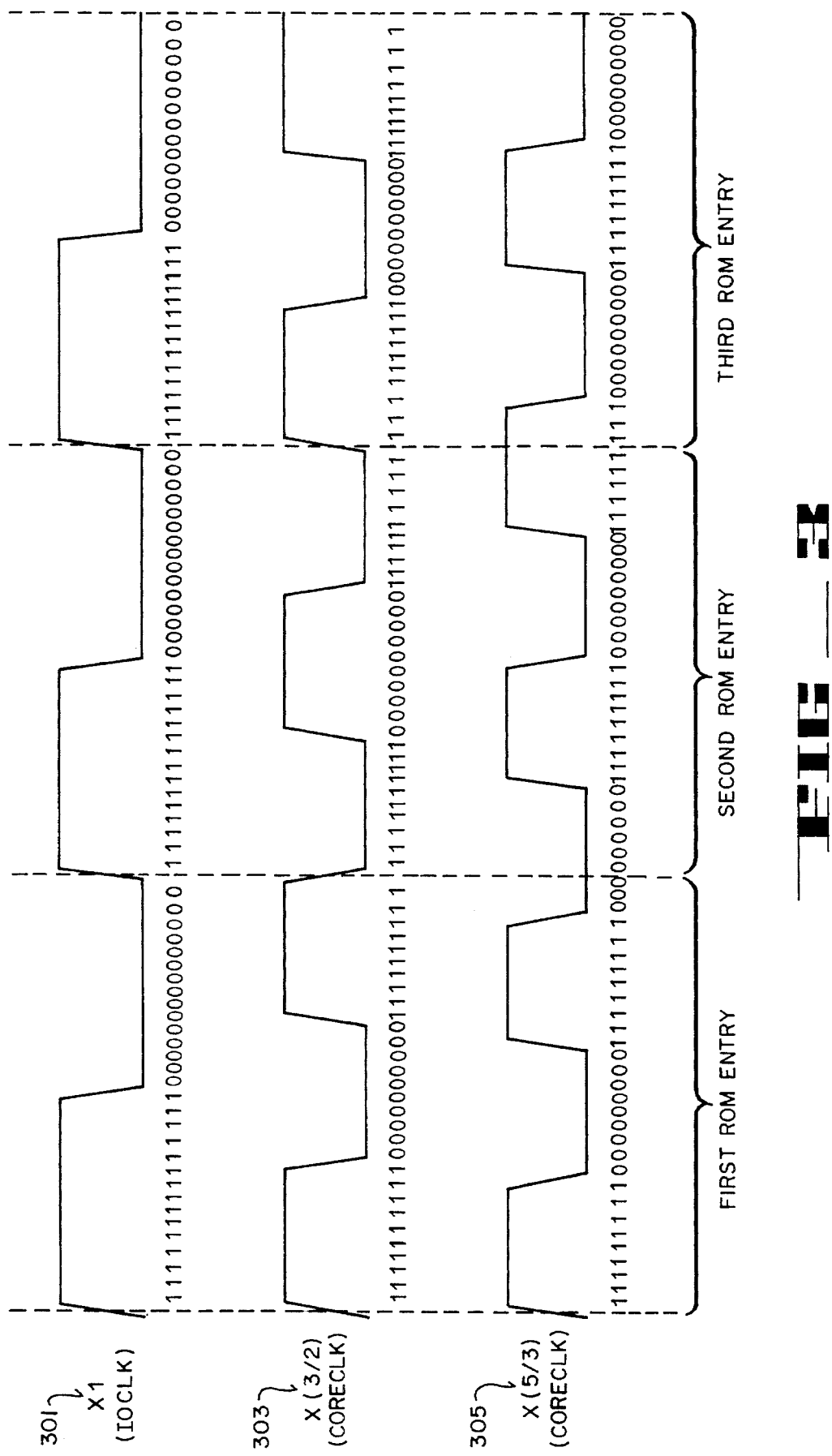
FIG. 3 is an illustration of synthesized waveforms and their corresponding ROM patterns used in the present invention.

In the presently preferred embodiment, the ICS 201 pattern ROM 239 is programmed to synthesize eight frequency P/Q multiples: 1/1, 3/2, 5/3, 2/1, 5/2, 3/1, 15/4, and 5/1. FIG. 3 shows the ROM-based patterns to synthesize 1/1, 3/2, and 5/3 multiples 301, 303, and 305. For waveform uniformity, the bit width of the ROM should equal an integer number for all P/Q multiples. A ROM bit width of 30 meets this requirement for each of the eight chosen P/Q multiples.

Accordingly, the presently preferred embodiment of ICS 201 uses dedicated 30 bit wide data paths to synthesize IOCLK 205 and CORECLK 206. SDL 207 generates 30 tap lines which provide timing edges at $T_P/30$ intervals, where $T_P$ is the period of XCLK 203. Pattern ROMs 231 and 239 correspondingly provide 30 bit patterns that specify the level to be output by each bit slice of IOCLK 205 or CORECLK 206 during waveform synthesis. IOCLK 205 and CORECLK 206 waveforms are synthesized bit by bit as each bit slice is activated. DTCs 225 and 233 convert each respective bit pattern received into a high or low level at its output as the corresponding SDL tap 208 goes high. Shifters 229 and 237 perform course phase shift, or delay, with a resolution of one bit, or $T_P/30$. Pattern registers 227 and 235 update patterns to their corresponding DTCs 225 and 233 with correct setup and hold times with respect to the SDL taps 208.

After each XCLK 203 period, the full patterns from each pattern ROMs 231 and 239 are updated. When updated, a pattern may be resynthesized, or a different pattern may be used, depending on which frequency P/Q multiple waveform is being synthesized. The number of ROM entries required to synthesize a multiple of P/Q equals Q. Thus, in order to generate each of the eight P/Q frequency multiples of the presently preferred embodiment: 1/1, 3/2, 5/3, 2/1, 5/2, 3/1, 15/4, and 5/1, a total of 1+2+3+1+2+1+4+1, or 15 total ROM pattern entries are necessary for pattern ROM 239 to synthesize CORECLK 206.

FIG. 3 shows sample ROM patterns used to synthesize frequency multiples 1/1, 3/2, and 5/3 in waveforms 301, 303, and 305. Since IOCLK 205 is synthesized at the same frequency as XCLK 203, pattern ROM 231 may simply be hard-wired to a 1/1 pattern-fifteen "1's" followed by fifteen "0's." In order for CORECLK 206 to be alignable with IOCLK 205, only CORECLK 206 P/Q frequency multiples returning an integer number from the relationship $N_{DP}/(P/Q)$, where $N_{DP}$ is the data path width. In the presently preferred embodiment, a data path width of 30 is used for $N_{DP}$, since this data path width allows synthesizing the eight P/Q frequency multiples supported by the presently preferred embodiment.

In order to deskew IOCLK 205 and CORECLK 206 with respect to XCLK 203, both coarse and fine adjustments are necessary. ICS 201 accomplishes coarse adjustments with shifters 229 and 237 by shifting the patterns received from pattern ROMs 231 and 239. By shifting the received patterns one bit at a time, the phase of IOCLK 205 and CORECLK 206 may be coarsely adjusted with a resolution of one SDL tap 208, or $T_P/30$ in the presently preferred embodiment.

Figure 4:
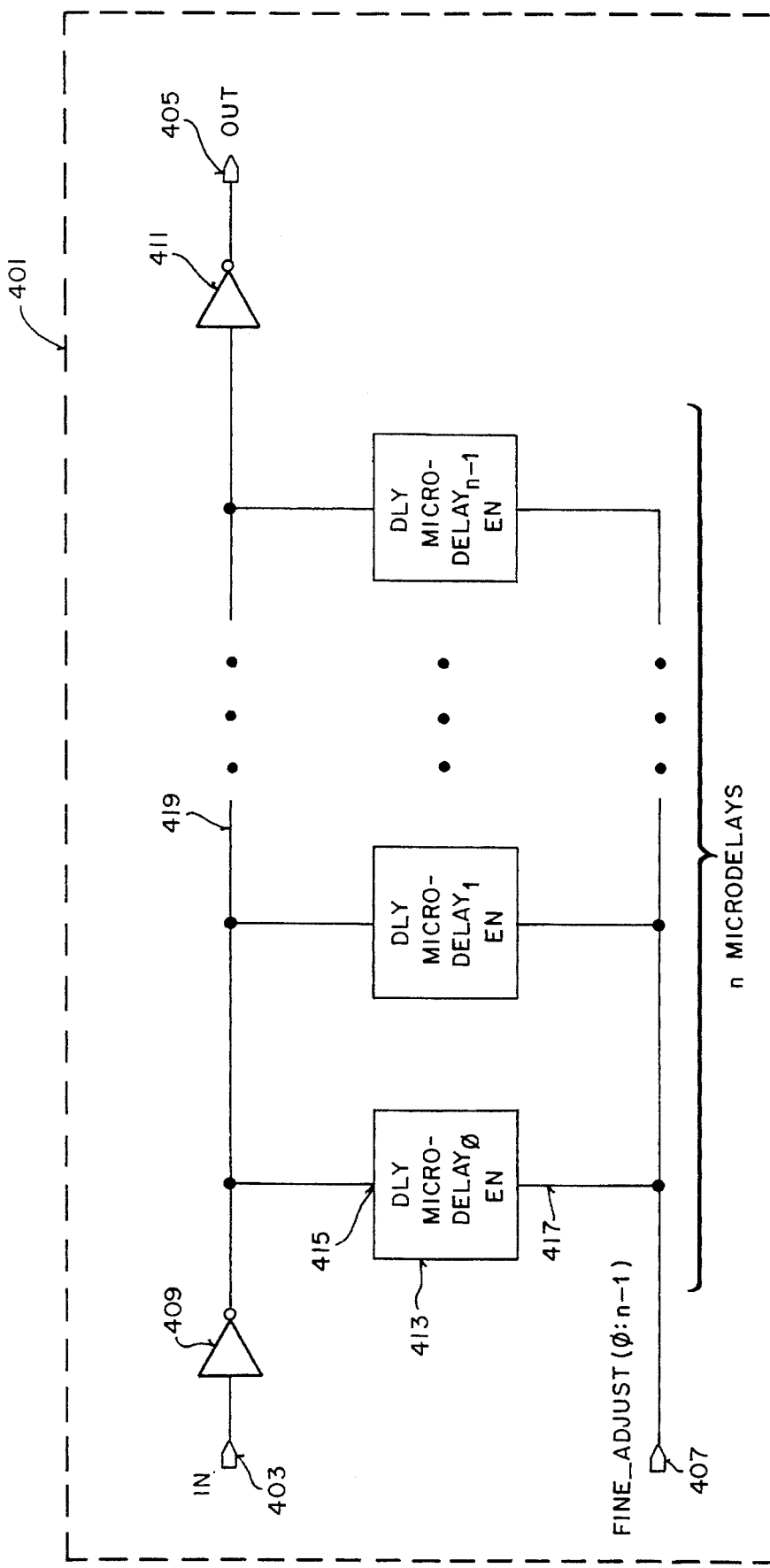
FIG. 4 is a block diagram of the presently preferred delay interpolator used in the present invention.

The delay required for perfect deskewing, however, requires fine phase adjustment of less than a $T_P/30$ interval. ICS 201 accomplishes fine adjustments with delay interpolators 211 and 213. FIG. 4 illustrates a simple delay interpolator circuit 401. Delay interpolator circuit 401 corresponds with delay interpolators 211 and 213. A synthesized waveform is received at IN 403 which is coupled to buffer 409. The output line 419 of buffer 409 is coupled to the input of buffer 411 which outputs a delayed synthesized waveform at OUT 405. Coupled to output line 419 are n microdelay elements 413. Each of the n microdelay elements 413 are coupled to output line 419 at DLY 415. Each of the n microdelay elements 413 are selectively enabled at EN 417 by FINE_ADJUST <0:n−1> 407. Thus, when no microdelay element 413 is enabled by FINE_ADJUST <0:n−1> 407, the added delay at OUT 405 is minimal. When all of the n microdelay elements 413 are enabled by FINE_ADJUST <0:n−1> 407, the delay at OUT 405 is maximized.

Fine adjustment interpolates the required delay within the $T_P/30$ interval. Delay interpolation is accomplished by adding or subtracting microdelay elements 413 to or from IOCLK 205 or CORECLK 206 until ideal deskew is achieved. The addition or subtraction of microdelay elements 413 is controlled by FINE_ADJUST <0:n−1> 407. In the presently preferred embodiment, deskewing is accomplished in single microdelay steps irrespective the required deskewing. Accordingly, microdelay elements 413 are activated or deactivated one microdelay element 413 at a time. Fine adjustment deskew resolution is the delay of one microdelay 413, which in the worst case is 0.05 ns.

The presently preferred embodiment of each microdelay element 413 for use with the present invention is described in the pending patent application, Ser. No. 08/394,677, filed on Feb. 24, 1995 and entitled "IMPROVED DIGITALLY-CONTROLLED CAPACITIVE LOAD."

Conceptually, deskew control 219, as shown in FIG. 2, deskews IOCLK 205 and CORECLK 206 with respect to XCLK 203 using two counters, a course adjust counter 245 and a fine adjust counter 247. The course adjust counter 245 controls the pattern shift amount using COARSE_ADJUST 221 and, thereby controls shifters 229 and 237 to phase shift the corresponding waveforms with a $T_P/30$ resolution. The fine adjust counter 247 controls the number of activated microdelay elements 413 in delay interpolators 211 and 213 using FINE_ADJUST 223 and, thereby interpolating the corresponding waveform phase shifts within the $T_P/30$ resolution boundaries.

The range of fine adjust counter 247 is zero to ICOUNT, where ICOUNT the number of microdelay elements 413 equivalent to, or "fit into," a single SDL tap 208 interval. Based on input received from phase detector 243, deskew control 219 steps fine adjust counter in the direction that reduces skew. When fine adjust counter 247 wraps around in the course of deskewing, coarse adjust counter 245 increments or decrements as appropriate.

For example, when increasing delay in CORECLK 206, fine adjust counter 247 is incremented and an additional microdelay element 413 is activated in a delay interpolator 213 using FINE_ADJUST 223. If the number of activated microdelay elements 413 in delay interpolator 213 is equal to ICOUNT (fine adjust counter 247= ICOUNT), however, course adjust counter 245 is incremented and COARSE_ADJUST 221 is used to shift the pattern in shifter 237 to increase the delay of CORECLK 206 by $T_P/30$. Fine adjust counter 247 is wrapped around to zero and all of the microdelay elements 413 in delay interpolator 213 are correspondingly deactivated.

Similarly, when decreasing the delay in CORECLK 206, fine adjust counter 247 is decremented and an additional microdelay element 413 is deactivated in delay interpolator 213 using FINE_ADJUST 223. If there are no activated microdelay elements 413 in delay interpolator 213 at the time (fine adjust counter 247=0), course adjust counter 245 is decremented and COARSE_ADJUST 221 is used to shift the pattern in shifter 237 to decrease the delay of CORECLK 206 by $T_P/30$. Fine adjust counter 247 is wrapped around to ICOUNT, thereby activating ICOUNT microdelay elements 413 in delay interpolator 213.

With XCLK 203 and IOCLK 205 coupled to the input of phase detector 243, the deskew process described above continues under feedback control until the XCLK/IOCLK skew is less than one microdelay. Assuming no effects of an output-load mismatch, the CORECLK 206 phase shift is identical to the IOCLK 205 phase shift.

Microdelay calibrator 209 is used to determine ICOUNT. The number of microdelays, ICOUNT, which correspond to one SDL tap 208 is determined such that ICOUNT·$t_{\mu DLY}$<$T_P/30$≦(ICOUNT+1)·$t_{\mu DLY}$, where $t_{\mu DLY}$ is the delay time of one microdelay delay element 413. ICOUNT is a function frequency, supply voltage, temperature, and circuit parameters. Microdelay element 413 time $t_{\mu DLY}$ is independent of frequency, but varies slowly over time with supply voltage, temperature, and circuit parameters. Thus, with a specific set of supply voltage, temperature, and circuit parameters, ICOUNT is proportional to $T_P$.

Figure 5:
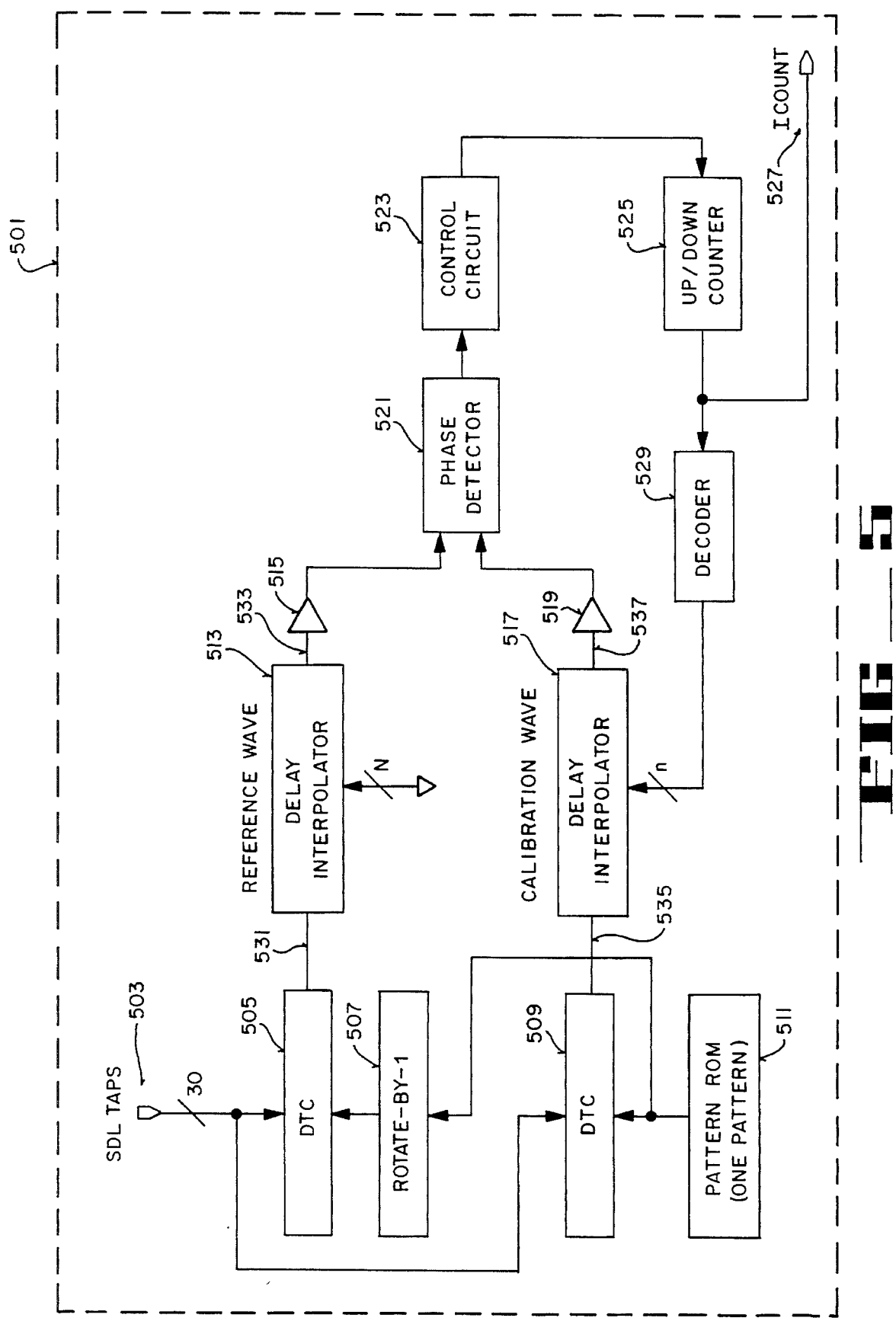
FIG. 5 is a block diagram illustrating the presently preferred microdelay calibrator used in the present invention.

Since ICOUNT is therefore a function of processing and operating conditions, including $T_P$, microdelay calibrator 209 must update ICOUNT continuously. FIG. 5 illustrates a microdelay calibrator 501 in block diagram form. Microdelay calibrator 501 is the presently preferred embodiment of the microdelay calibrator 209 of FIG. 2. Two DTCs 505 and 509 are coupled to receive inputs from 30 SDL taps 503. DTC 509 synthesizes a calibration waveform to delay interpolator 517 from pattern received from pattern ROM 511. The preferred embodiment of delay interpolator 517 is delay interpolator 401, illustrated in FIG. 4. Rotate-by-1 rotator 507 rotates the pattern received from pattern ROM 511 as input to DTC 505 which synthesizes a calibration waveform to delay interpolator 513. Phase detector 521 receives the reference waveform from delay interpolator 513 through buffer 515. Phase detector 521 also receives the calibration waveform from delay interpolator 517 through buffer 519. Control circuit 523 receives input from phase detector 521, and generates ICOUNT 527 through up/down counter 525. Delay interpolator 517 is provided n lines of feedback control input from up/down counter 525 through of decoder 529.

The reference and calibration waveforms synthesized by DTC 505 and 509 are produced in parallel. Since the pattern received by DTC 505 from pattern ROM 511 is rotated-by-1 bit, the synthesized waveform is delayed, or phase shifted by $T_P/30$. Thus, the difference in delay between points 531 and 535 is $T_P/30$. All microdelay elements 413 of delay interpolator 513 are deactivated so the delay of the reference waveform at point 533 is substantially equal to the delay at point 531. Delay interpolator 513 is coupled to DTC 505 in order to equalize the parasitic loads attached to DTCs 505 and 509.

The microdelay elements 413 of delay interpolator 517 are controlled by control circuit 523. The difference in delay of the calibration waveform between points 535 and 537 is based on the number of microdelay elements 413 that are activated in delay interpolator 517. Control circuit 523 includes up/down counter circuitry 525 which indicates the number of microdelay elements 413 activated in delay interpolator 517 at any particular time. The reference and calibration waveforms output from delay interpolators 513 and 517, respectively, are input to phase detector 521.

Phase detector 521 identifies any phase difference between the two waveforms and provides this information to control circuit 523. If the delay at point 533 is greater than the delay at point 537, then control circuit increments the number of activated microdelay elements 413 in delay interpolator 517. If, on the other hand, the delay at point 533 is less than the delay at point 537, then control circuit decrements the number of activated microdelay elements 413 in delay interpolator 517. The process continues until there is no difference delay, or phase difference, between the two waveforms input into phase detector 521. At that time, the number of activated microdelay elements 413 in delay interpolator is indicated in the up/down counter 527. This number is ICOUNT 527 and is output by microdelay calibrator 501. The number on ICOUNT 527 is updated periodically in order to monitor changes in $t_{\mu DLY}$, the delay time of microdelay element 413.

The presently preferred embodiment of the phase detector used in both deskewing (phase detector 243) and in microdelay calibration (phase detector 521) is described in the pending patent application, Ser. No. 08/433,810, filed on May 3, 1995, and entitled "PHASE DETECTOR WITH EDGE-SENSITIVE ENABLE & DISABLE."

Thus, an interpolating clock synthesizer featuring delay interpolation circuitry is described. The described delay interpolation circuitry provides fine and coarse deskew resolution, independent of frequency, to the waveforms synthesized by the delay interpolation circuitry described herein. Although the present invention has been described in terms of a preferred embodiment, it will be appreciated that various modifications and alterations might be made by those skilled in the art without departing from the spirit and scope of the present invention.

I claim:

1. An integrated circuit for deskewing a synthesized waveform, the synthesized waveform being generated by a first digital-to-time domain converter in response to a pattern received from a shifter, the first digital-to-time domain converter being coupled to a synchronous delay line, the synchronous delay line generating a plurality of taps in response to a reference signal, each one of the plurality of taps coupled to the first digital-to-time domain converter, each one of the plurality of taps having a unit delay, the integrated circuit comprising:

a calibration circuit coupled to the synchronous delay line;

a delay interpolation circuit coupled to the first digital-to-time domain converter, the delay interpolation circuit generating a deskewed synthesized waveform; and a deskew control circuit coupled to the calibration circuit, the shifter, and the delay interpolation circuit.

2. The integrated circuit described in claim 1 wherein the delay interpolation circuit outputs the deskewed synthesized waveform on an output signal line, the delay interpolation circuit comprising a first plurality of microdelay elements attached to the output signal line.

3. The integrated circuit described in claim 2 wherein the deskew control circuit selectively activates each one of the first plurality of microdelay elements through a fine adjust signal line.

4. The integrated circuit described in claim 3 wherein the deskew control circuit receives a count signal from the calibration circuit, the count signal representing a number of microdelay elements substantially equivalent to the unit delay.

5. The integrated circuit described in claim 4 wherein the deskew control circuit is coupled to the shifter through a coarse adjust signal line, the shifter being coupled to the first digital-to-time domain converter through a first pattern register, the deskew control circuit outputting a coarse adjust signal to the shifter circuit.

6. The integrated circuit described in claim 5 wherein the shifter shifts the pattern in response to the coarse adjust signal, the synthesized waveform being phase shifted when the shifter shifts the pattern in response to the coarse adjust signal.

7. The integrated circuit described in claim 6 wherein the deskew control circuit increases the delay of the synthesized waveform by the unit delay when the number of microdelay elements substantially equivalent to the unit delay have been activated, the deskew control circuit deactivating all of the first plurality of microdelay elements after the delay of the synthesized waveform is increased by the unit delay with the shifter in response to the course adjust signal.

8. The integrated circuit described in claim 7 wherein the deskew control circuit decreases the delay of the synthesized waveform by the unit delay when no microdelay elements have been activated, the deskew control circuit activating the number of microdelay elements substantially equivalent to the unit delay after the delay of the synthesized waveform is decreased by the unit delay with the shifter in response to the course adjust signal.

9. The integrated circuit described in claim 8 wherein the calibration circuit comprises:

a reference path circuit coupled to the synchronous delay line, the reference path circuit synthesizing a reference path waveform;

a calibrated path circuit coupled to the synchronous delay line, the calibrated path circuit synthesizing a calibrated path waveform;

a phase detector receiving the reference path waveform and the calibrated path waveform; and a second control circuit coupled to the phase detector and the calibrated path circuit.

10. The integrated circuit described in claim 9 wherein the reference path circuit comprises:

a second digital-to-time domain converter coupled to the synchronous delay line, the second digital-to-time domain converter synthesizing the reference path waveform through a reference path signal line; and a rotate-by-1 rotator coupled to the second digital-to-time domain converter and a pattern ROM, the rotate-by-1 rotator introducing the one unit delay into the reference path waveform.

11. The integrated circuit described in claim 10 wherein the calibrated path circuit comprises:

a third digital-to-time domain converter coupled to the synchronous delay line and the pattern ROM, the third digital-to-time domain converter synthesizing the calibrated path waveform through a calibrated path signal line; and a second plurality of microdelay elements attached to the calibrated path signal line, the second plurality of microdelay elements selectively activated and deactivated by the second control circuit in response to the phase detector, the second plurality of microdelay elements adding a first parasitic load to the calibrated path signal line.

12. The integrated circuit described in claim 11 wherein the phase detector indicates when there is substantially no phase difference between the reference path waveform and the calibrated path waveform.

13. The integrated circuit described in claim 12 wherein the second control circuit generates the count signal in response to the phase detector.

14. The integrated circuit described in claim 13 wherein a second parasitic load is coupled to the reference path signal line, the second parasitic load being substantially equal to the first parasitic load.

\* \* \* \* \*